(12) United States Patent  
Chen

(10) Patent No.: US 12,243,595 B2
(45) Date of Patent: Mar. 4, 2025

(54) SOLID-STATE DRIVE CONTROLLER AND CIRCUIT CONTROLLER

(71) Applicant: REALTEK SEMICONDUCTOR CORPORATION, Hsinchu (TW)

(72) Inventor: Yen-Chung Chen, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 157 days.

(21) Appl. No.: 18/104,679

(22) Filed: Feb. 1, 2023

(65) Prior Publication Data
US 2023/0386582 A1 Nov. 30, 2023

(30) Foreign Application Priority Data
May 25, 2022 (TW) .................................. 111119552

(51) Int. Cl.
*G11C 16/30* (2006.01)
*G06F 3/06* (2006.01)
(52) U.S. Cl.
CPC ............ *G11C 16/30* (2013.01); *G06F 3/0653* (2013.01); *G06F 3/0679* (2013.01)
(58) Field of Classification Search
CPC .................................................... G11C 16/30
(Continued)

(56) References Cited

U.S. PATENT DOCUMENTS

| 5,671,179 A | * | 9/1997 | Javanifard | .............. | G11C 16/30 |
| | | | | | 365/230.03 |
| 5,831,302 A | * | 11/1998 | McIntyre | ............... | G11C 5/147 |
| | | | | | 365/226 |

(Continued)

FOREIGN PATENT DOCUMENTS

| TW | I716989 B | 1/2021 |
| TW | I724524 B | 4/2021 |
| TW | I755739 B | 2/2022 |

OTHER PUBLICATIONS

1) OA letter of a counterpart TW application (appl. No. 111119552) mailed on Jan. 6, 2023. 2) Summary of the TW OA letter in regard to the TW countepart application: (1) Claims 1, 2, 5, 6, 9, and 10 are rejected as being unpatentable over (TW I755739 B, also published as US20210373800A1) in view of (TWI716989B, also published as U.S. Pat. No. 11,293,962B2) and further in view of (TWI724524B, also published as US20210065822A1).

*Primary Examiner* — Sung Il Cho
(74) *Attorney, Agent, or Firm* — WPAT, PC

(57) ABSTRACT

A solid-state drive (SSD) controller is operable to determine whether M supply voltage(s) supplied to a NAND flash memory is correct. The SSD controller includes: a voltage detector configured to receive the M supply voltage(s) and thereby generate a detection result, wherein the M is a positive integer; a voltage inquiry module configured to output an inquiry signal to the NAND flash memory and thereby receive a response signal from the NAND flash memory, and configured to generate an inquiry result according to the response signal, wherein the inquiry result indicates M specified supply voltage(s) applicable to the NAND flash memory; and a voltage decision module configured to receive the detection result and the inquiry result, and configured to determine whether the M supply voltage(s) is/are equivalent to the M specified voltage(s) according to the detection result and the inquiry result and thereby generate a decision result.

18 Claims, 1 Drawing Sheet

(58) Field of Classification Search
USPC .......................................................... 365/226
See application file for complete search history.

(56) References Cited

U.S. PATENT DOCUMENTS

| | | | | |
|---|---|---|---|---|
| 6,175,521 | B1* | 1/2001 | Pascucci | G11C 16/30 |
| | | | | 365/185.23 |
| 11,293,962 | B2 | 4/2022 | Rowley | |
| 2002/0163826 | A1* | 11/2002 | Devlin | G06F 1/26 |
| | | | | 365/51 |
| 2004/0001359 | A1* | 1/2004 | Ott | G11C 5/143 |
| | | | | 365/185.18 |
| 2004/0201414 | A1* | 10/2004 | Pasotti | G11C 16/30 |
| | | | | 327/519 |
| 2016/0266199 | A1* | 9/2016 | Kurosawa | G11C 16/30 |
| 2021/0065822 | A1 | 3/2021 | Rowley | |
| 2021/0373800 | A1 | 12/2021 | Chiu | |

* cited by examiner

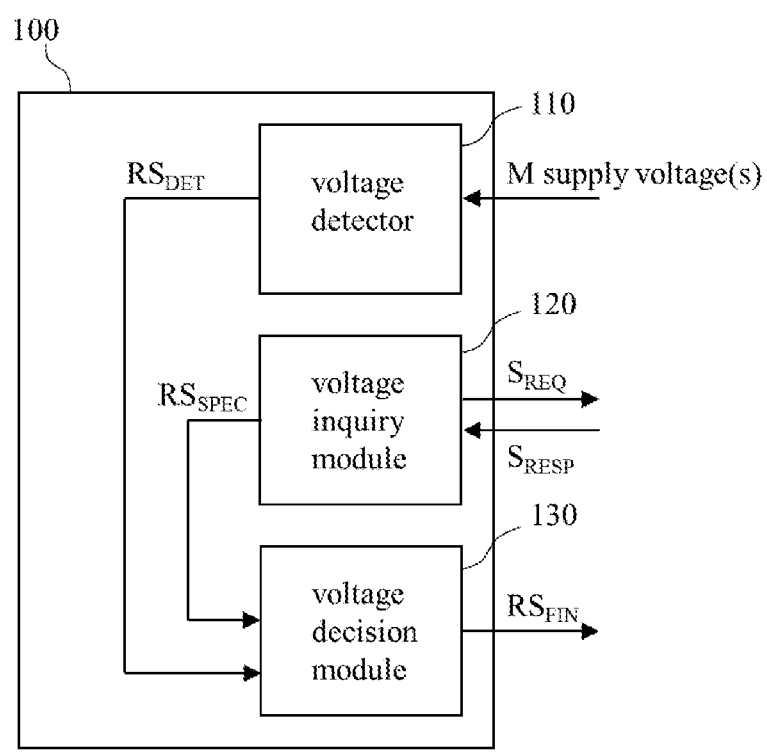

SOLID-STATE DRIVE CONTROLLER AND CIRCUIT CONTROLLER

BACKGROUND OF THE INVENTION

1. Field of the Invention

The present disclosure relates to a controller operable to determine whether a supply voltage is correct, especially to a controller operable to determine whether a supply voltage supplied to a controlled circuit is correct.

2. Description of Related Art

A solid-state drive (SSD) usually includes a NAND flash memory as storage components. Generally, the supply voltages for a NAND flash memory includes an internal circuit supply voltage (VCC) and an input/output (I/O) interface supply voltage (VCCQ). As semiconductor processes develop, NAND flash memories of different specifications are manufactured, and the supply voltages for these NAND flash memories are usually determined to fill different voltage requirements, respectively. If a supply voltage for a NAND flash memory is incorrect, the NAND flash memory may not operate normally, or the service life of the NAND flash memory may be affected. For example, the VCC could be 3.3 volts (3.3V) or 2.5 volts (2.5V), and the VCCQ could be 3.3V, 1.8 volts (1.8V), or 1.2 volts (1.2V); and more kinds of supply voltages for NAND flash memories in the future are predictable. Many kinds of voltage setting bring troubles in production to SSD module makers, and when the SSD module makers want to ascertain the causes of production problems and solve the problems, the SSD module makers should have engineers to check whether erroneous voltage setting cause an SSD to operate abnormally, which is inefficient.

SUMMARY OF THE INVENTION

An object of the present disclosure is to provide a solid-state drive (SSD) controller and a circuit controller capable of automatically determining whether incorrect voltage setting causes an SSD/controlled circuit to operate abnormally.

An embodiment of the SSD controller of the present disclosure is operable to determine whether M supply voltage(s) supplied to a NAND flash memory is correct. This embodiment includes a voltage detector, a voltage inquiry module, and a voltage decision module. The voltage detector is configured to receive the M supply voltage(s) and thereby generate a detection result, wherein the M is a positive integer. The voltage inquiry module is configured to output an inquiry signal to the NAND flash memory and thereby receive a response signal from the NAND flash memory, and the voltage inquiry module is further configured to generate an inquiry result according to the response signal, wherein the inquiry result indicates M specified supply voltage(s) applicable to the NAND flash memory. The voltage decision module is configured to receive the detection result and the inquiry result, and further configured to determine whether the M supply voltage(s) is/are equivalent to the M specified voltage(s) according to the detection result and the inquiry result and thereby generate a decision result.

An embodiment of the circuit controller of the present disclosure is operable to determine whether M supply voltage(s) supplied to a controlled circuit is correct. This embodiment includes a voltage detector, a voltage inquiry module, and a voltage decision module. The voltage detector is configured to receive the M supply voltage(s) and thereby generate a detection result, wherein the M is a positive integer. The voltage inquiry module is configured to output an inquiry signal to the controlled circuit and thereby receive a response signal from the controlled circuit, and the voltage inquiry module is further configured to generate an inquiry result according to the response signal, wherein the inquiry result indicates M specified supply voltage(s) applicable to the controlled circuit. The voltage decision module is configured to receive the detection result and the inquiry result, and further configured to determine whether the M supply voltage(s) is/are equivalent to the M specified voltage(s) according to the detection result and the inquiry result and thereby generate a decision result.

These and other objectives of the present invention will no doubt become obvious to those of ordinary skill in the art after reading the following detailed description of the preferred embodiments that are illustrated in the various FIGURES and drawings.

BRIEF DESCRIPTION OF THE DRAWINGS

FIG. 1 shows an embodiment of the circuit controller of the present disclosure.

DETAILED DESCRIPTION OF THE PREFERRED EMBODIMENTS

The present specification discloses a circuit controller operable to determine whether supply voltages supplied to a controlled circuit are correct. The circuit controller can be a solid-state drive (SSD) controller or a memory controller such as an Embedded Multimedia Card (eMMC) controller, a Universal Flash Storage (UFS) controller, or a Secure Digital (SD) memory card controller, but the present invention is not limited thereto. The controlled circuit is a memory such as a NAND flash memory.

FIG. 1 shows an embodiment of the circuit controller of the present disclosure. The circuit controller 100 (e.g., an SSD controller) of FIG. 1 is operable to determine whether M supply voltage(s) supplied to a controlled circuit (e.g., a NAND flash memory) (not shown in the FIGURES) is correct, wherein the M is a positive integer. For example, the M is an integer equal to or greater than two; the M supply voltages include an internal circuit supply voltage (VCC) and/or an input/output (I/O) interface supply voltage (VCCQ). The definitions of the VCC and VCCQ are well known in this technical field. The SSD controller 110 includes a voltage detector 110, a voltage inquiry module 120, and a voltage decision module 130. These circuits are described in the following paragraphs, respectively.

Regarding the embodiment of FIG. 1, the voltage detector 110 is configured to receive the M supply voltage(s) and thereby generate a detection result $RS_{DET}$. An exemplary implementation of the voltage detector 110 includes a conventional/self-developed analog-to-digital converter (not shown) which is configured to generate the detection result $RS_{DET}$ according to the M supply voltage(s); however, the implementation of the voltage detector 110 is not limited to the above instance. Any conventional/self-developed detector (e.g., a digital/analog voltage meter capable of converting a voltage signal into a digital signal) that can be used for detecting and measuring the M supply voltage(s) can replace the analog-to-digital converter. It is noted that when the M is greater than one, the voltage detector 110 receives and processes the M supply voltages in sequence, or the voltage detector 110 receives the M supply voltages through M paths simultaneously and then processes these supply voltages; accordingly, the detection result $RS_{DET}$ includes M parts that are respectively corresponding to the M supply voltages. For example, when the M supply voltages are the aforementioned VCC and VCCQ, the detection result $RS_{DET}$ includes a first part $RS_{DET\_1}$ corresponding to the VCC and includes a second part $RS_{DET\_2}$ corresponding to the VCCQ.

Regarding the embodiment of FIG. 1, the voltage inquiry module 120 is configured to output an inquiry signal $S_{REQ}$ to the controlled circuit (e.g., a NAND flash memory) to ask the controlled circuit to provide information about supply voltages applicable to the controlled circuit. Afterward, the voltage inquiry module 120 receives a response signal $S_{RESP}$ from the controlled circuit and then generates an inquiry result $RS_{SPEC}$ according to the response signal $S_{RESP}$, wherein the response signal $S_{RESP}$ is outputted by the controlled circuit in response to the inquiry signal $S_{REQ}$, and the inquiry result $RS_{SPEC}$ indicates M specified supply voltage(s) applicable to the controlled circuit. It is noted that when the M is greater than one, the inquiry result $RS_{SPEC}$ includes M parts that are respectively corresponding to the M specified supply voltages. For example, when the M supply voltages are the aforementioned VCC and VCCQ, the inquiry result $RS_{SPEC}$ includes a first part $RS_{SPEC\_1}$ indicating a first specified supply voltage $VCC_{SPEC}$ and includes a second part $RS_{SPEC\_2}$ indicating a second specified supply voltage $VCCQ_{SPEC}$, wherein the $VCC_{SPEC}$ and the $VCCQ_{SPEC}$ are the answers to the setting of the VCC and the VCCQ respectively.

Regarding the embodiment of FIG. 1, the voltage decision module 130 is configured to receive the detection result $RS_{DET}$ and the inquiry result $RS_{SPEC}$, and the voltage decision module 130 is further configured to determine whether the M supply voltage(s) is/are equivalent to the M specified voltage(s) according to the detection result $RS_{DET}$ and the inquiry result $RS_{SPEC}$ and thereby generate a decision result $RS_{FIN}$. In an exemplary implementation, when the M supply voltage(s) is/are different from the M specified supply voltage(s), the voltage decision module 130 outputs the decision result $RS_{FIN}$ as the basis for the manual/automatic adjustment in the M supply voltage(s). For example, the decision result $RS_{FIN}$ is a warning signal (e.g., a control signal for an indication light and/or a speaker) for notifying a user that the M supply voltage(s) is/are erroneous. It is noted that when the M is greater than one, the decision result $RS_{FIN}$ can be a single result or composed of M parts that are outputted in sequence, wherein the single result is for indicating whether the M supply voltages as a whole is erroneous, and the M parts are respectively corresponding to the M supply voltages and each part indicates whether its corresponding supply voltage is erroneous. For example, when the M supply voltages are the aforementioned VCC and VCCQ, the decision result $RS_{FIN}$ includes a first part $RS_{FIN\_1}$ indicating whether the VCC is incorrect and includes a second part $RS_{FIN\_2}$ indicating whether the VCCQ is incorrect.

Referring to FIG. 1, an exemplary implementation of the circuit controller 100 further includes a conventional/self-developed processor (not shown in the FIGURES). The processor runs firmware to realize at least one of the voltage inquiry module 120 and the voltage decision module 130. The content of the firmware can be derived from the descriptions of the voltage inquiry module 120 and/or the voltage decision module 130 in this specification and realized with known programming languages. Since the processor is usually inherent in the circuit controller 100, the circuit controller 100 does not incorporate additional hardware to realize the voltage inquiry module 120 and/or the voltage decision module 130; accordingly, this implementation is cost-effective.

Referring to FIG. 1, in an exemplary implementation of the circuit controller 100 each or both of the voltage inquiry module 120 and the voltage decision module 130 is/are hardware circuits. The detail of the hardware circuits can be derived from the descriptions of the voltage inquiry module 120 and/or the voltage decision module 130 in this specification. Since the hardware circuits can generate the inquiry result $RS_{SPEC}$ and/or the decision result $RS_{FIN}$ rapidly in comparison with the aforementioned firmware manner, this implementation usually achieves better performance.

Referring to FIG. 1, in an exemplary implementation of the circuit controller 100 the response signal $S_{RESP}$ includes an identification (ID) of the controlled circuit (e.g., a NAND flash memory), and the voltage inquiry module 120 searches data (e.g., information about the specified supply voltage(s) applicable to multiple kinds of NAND flash memories) prestored in the voltage inquiry module 120 or in some storage device accessible to the voltage inquiry module 120 according to the ID to find out the M specified supply voltage(s) applicable to the controlled circuit and thereby generates the inquiry result $RS_{SPEC}$. In an exemplary implementation, the response signal $S_{RESP}$ includes at least one parameter (e.g., data retrieved from a one-time programmable (OTP) storage component of the controlled circuit, the data including information about the specified supply voltage(s) applicable to the controlled circuit) of the controlled circuit, and the voltage inquiry module 120 analyzes the at least one parameter to find out the M specified supply voltage(s) applicable to the controlled circuit and thereby generates the inquiry result $RS_{SPEC}$.

It is noted that the circuit controller 100 may include other circuits and functions for controlling the controlled circuit, but these are beyond the scope of the present disclosure.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure.

To sum up, the circuit controller (e.g., an SSD controller) of the present disclosure can automatically determine whether the supply voltage(s) for a controlled circuit (e.g., a NAND flash memory) is correct and thereby rapidly determine whether erroneous voltage setting causes the controlled circuit to operate abnormally.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A solid-state drive (SSD) controller capable of determining whether M supply voltage(s) supplied to a NAND flash memory is correct, the SSD controller comprising:
   a voltage detector configured to receive the M supply voltage(s) and thereby generate a detection result, wherein the M is a positive integer;
   a voltage inquiry module configured to output an inquiry signal to the NAND flash memory and thereby receive a response signal from the NAND flash memory, and the voltage inquiry module further configured to generate an inquiry result according to the response signal, wherein the inquiry result indicates M specified supply voltage(s) applicable to the NAND flash memory; and a voltage decision module configured to receive the detection result and the inquiry result, and further configured to determine whether the M supply voltage(s) is/are equivalent to the M specified voltage(s) according to the detection result and the inquiry result and thereby generate a decision result, wherein the response signal includes at least one of following:

an identification (ID) of the NAND flash memory, which allows the voltage inquiry module to search prestored data according to the ID to find out the M specified supply voltage(s) applicable to the NAND flash memory and thereby generate the inquiry result; and at least one parameter including data retrieved from a storage component of the NAND flash memory, which allows the voltage inquiry module to analyze the at least one parameter to find out the M specified supply voltage(s) applicable to the NAND flash memory and thereby generate the inquiry result.

2. The SSD controller of claim 1, wherein the M is equal to or greater than two.

3. The SSD controller of claim 1, wherein the voltage detector includes an analog-to-digital converter for generating the detection result according to the M supply voltage(s).

4. The SSD controller of claim 1, wherein the SSD controller includes a processor executing firmware to realize at least one of the voltage inquiry module and the voltage decision module.

5. The SSD controller of claim 1, wherein at least one of the voltage inquiry module and the voltage decision module is hardware.

6. The SSD controller of claim 1, wherein the M supply voltage(s) include(s) an internal circuit supply voltage and an input/output (I/O) interface supply voltage.

7. The SSD controller of claim 1, wherein the response signal includes the identification (ID) of the NAND flash memory.

8. The SSD controller of claim 1, wherein the response signal includes the at least one parameter.

9. A circuit controller capable of determining whether M supply voltage(s) supplied to a controlled circuit is correct, the circuit controller comprising:

a voltage detector configured to receive the M supply voltage(s) and thereby generate a detection result, wherein the M is a positive integer;

a voltage inquiry module configured to output an inquiry signal to the controlled circuit and thereby receive a response signal from the controlled circuit, and the voltage inquiry module further configured to generate an inquiry result according to the response signal, wherein the inquiry result indicates M specified supply voltage(s) applicable to the controlled circuit; and a voltage decision module configured to receive the detection result and the inquiry result, and further configured to determine whether the M supply voltage(s) is/are equivalent to the M specified voltage(s) according to the detection result and the inquiry result and thereby generate a decision result, wherein the response signal includes at least one of following:

an identification (ID) of the controlled circuit, which allows the voltage inquiry module to search prestored data according to the ID to find out the M specified supply voltage(s) applicable to the controlled circuit and thereby generate the inquiry result; and at least one parameter including data retrieved from a storage component of the controlled circuit, which allows the voltage inquiry module to analyze the at least one parameter to find out the M specified supply voltage(s) applicable to the controlled circuit and thereby generate the inquiry result.

10. The circuit controller of claim 9, wherein the M is equal to or greater than two.

11. The circuit controller of claim 9, wherein the voltage detector includes an analog-to-digital converter for generating the detection result according to the M supply voltage(s).

12. The circuit controller of claim 9, wherein the circuit controller includes a processor executing firmware to realize at least one of the voltage inquiry module and the voltage decision module.

13. The circuit controller of claim 9, wherein at least one of the voltage inquiry module and the voltage decision module is hardware.

14. The circuit controller of claim 9, wherein the M supply voltage(s) include(s) an internal circuit supply voltage and an input/output (I/O) interface supply voltage.

15. The circuit controller of claim 9, wherein the response signal includes the identification (ID) of the controlled circuit.

16. The circuit controller of claim 9, wherein the response signal includes the at least one parameter.

17. The circuit controller of claim 9, wherein the circuit controller is a solid-state drive (SSD).

18. The circuit controller of claim 9, wherein the controlled circuit is a NAND flash memory.

\* \* \* \* \*